United States Patent
Liveris et al.

(10) Patent No.: US 9,628,095 B1
(45) Date of Patent: Apr. 18, 2017

(54) PARAMETERIZABLE METHOD FOR SIMULATING PLL BEHAVIOR

(75) Inventors: Nikolaos Liveris, San Ramon, CA (US); Kevin W. Mai, San Jose, CA (US); Jakob Jones, San Jose, CA (US); Yury Markovskiy, San Jose, CA (US); Jeffrey Fox, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 786 days.

(21) Appl. No.: 13/604,577

(22) Filed: Sep. 5, 2012

(51) Int. Cl.
*G06F 17/50* (2006.01)
*H03L 7/14* (2006.01)

(52) U.S. Cl.
CPC .................. *H03L 7/145* (2013.01)

(58) Field of Classification Search
CPC ............................................. H03L 7/145
USPC ......................................................... 703/19
See application file for complete search history.

(56) References Cited

U.S. PATENT DOCUMENTS

| | | | | |
|---|---|---|---|---|
| 6,052,524 A * | 4/2000 | Pauna | | 703/22 |
| 6,993,469 B1 * | 1/2006 | Bortfeld | | 703/15 |
| 7,324,403 B2 * | 1/2008 | To et al. | | 365/233.1 |
| 7,606,694 B1 * | 10/2009 | Carrillo et al. | | 703/14 |
| 8,086,974 B2 | 12/2011 | Feng | | |
| 2003/0163497 A1 * | 8/2003 | Reese | | 708/271 |
| 2003/0163775 A1 * | 8/2003 | Reese | | 714/752 |
| 2003/0188299 A1 * | 10/2003 | Broughton et al. | | 717/141 |
| 2004/0133866 A1 * | 7/2004 | Shim | | 716/6 |
| 2004/0172226 A1 * | 9/2004 | Valley et al. | | 703/2 |
| 2006/0149526 A1 * | 7/2006 | Torossian et al. | | 703/16 |
| 2007/0160158 A1 * | 7/2007 | Zeng et al. | | 375/260 |
| 2008/0005709 A1 | 1/2008 | Golander | | |
| 2008/0273641 A1 * | 11/2008 | Yang et al. | | 375/359 |
| 2008/0291893 A1 * | 11/2008 | Yang et al. | | 370/350 |
| 2009/0168933 A1 * | 7/2009 | Gao | | 375/354 |
| 2009/0268091 A1 * | 10/2009 | Kouyama | | 348/515 |
| 2010/0114552 A1 * | 5/2010 | Cai et al. | | 703/14 |
| 2011/0295586 A1 | 12/2011 | Yin et al. | | |
| 2012/0119800 A1 * | 5/2012 | Yamasaki et al. | | 327/142 |

OTHER PUBLICATIONS

C. Barrett, "Fractional/Integer-N PLL Basics," Texas Instruments Technical Brief SWRA029, Wireless Communication Business Unit, Aug. 1999.*

* cited by examiner

*Primary Examiner* — Hugh Jones

(57) ABSTRACT

Methods for designing and developing models for simulating the behavior of clock signals and in particular those generated by phase-locked loop (PLL) circuits are provided. The clock period of a phase-locked loop circuit's variable frequency oscillator signal may be modeled by combining the inverse of the oscillator frequency rounded up to the simulation time scale with the inverse rounded down to the simulation time scale. The variable frequency oscillator signal may further be synchronized with a reference clock signal at a rate determined by the relationship between the reference clock signal and the variable frequency oscillator signal. A parameter may indicate a target range for the deviation between the two signals and a runtime monitor may be used together with the parameter setting to decide whether synchronization is required and make the appropriate adjustments.

28 Claims, 4 Drawing Sheets

PARAMETERIZABLE METHOD FOR SIMULATING PLL BEHAVIOR

BACKGROUND

This invention relates to methods for designing and developing models for simulating the behavior of electronic circuits, and more particularly, to methods for designing and developing models for simulating the behavior of clock signals in electronic circuits, especially if those clock signals are generated by a phase-locked loop circuit.

Simulating the behavior of an electronic circuit requires the use of a simulator, values for the input signals of the electronic circuit (sometimes referred to as stimuli), a digital representation of the electronic circuit (e.g., a simulation model), and expected values for the output signals of the electronic circuit that the simulation model is supposed to produce in response to the stimuli. The simulation model is often organized hierarchically and instantiates other simulation models, especially if the electronic circuit instantiates intellectual property (IP) blocks which often have their own simulation models.

During simulation, the simulator first loads and pre-processes the simulation model to create a simulator-internal representation that enables the computation and tracking of signals inside the electronic circuit. The simulator then feeds the stimuli to the inputs of the simulator-internal representation and propagates them successively towards the outputs of the simulator-internal representation by computing the values of intermediate signals and finally output signals when those signals reach the outputs. The simulation is based on a simulation time scale and the simulator updates the values of signals according to an ordering of events which may occur at discrete consecutive time steps of the simulation time scale. Since the events are updated at discrete time intervals and not continuously, the simulation time scale inherently has a limited resolution. The resolution of the simulation time scale may be defined by a user. As a final step, the simulator compares the values of the computed output signals to the expected output signal values. Mismatches between actual values and expected values, often referred to as simulation mismatches, indicate unexpected behavior of the electronic circuit and need to be investigated.

Simulation model shortcomings may also cause mismatches between actual and expected values. A common problem is the modeling of clock signals which are typically defined by their frequency and duty cycle. The duty cycle is the percentage of time for each clock period that the clock signal is at a high level. In simulation, clock signals are often modeled using a constant clock period and explicitly defining rising and falling clock edges within that period. The clock period is typically defined as the inverse of the clock frequency. However, due to the limited resolution of the simulation time scale, some clock periods may carry a rounding error whereas others may not. For example, a clock signal having a frequency of 100 MHz has a clock period of 10 ns. This clock period has no rounding error if the resolution of the simulation time scale is 1 ns. However, a clock signal with a frequency of 400 MHz has a clock period of 2.5 ns and thus a rounding error for the same resolution. This leads to so called edge drifting during simulation in which deviation between the rising and falling edges of clocks with rounding errors and clocks without rounding errors increases with increasing simulation time. Increased deviation over simulation time may eventually lead to changes in the ordering of simulation events and potentially cause simulation failures.

Clock signals are often generated by phase-locked loop (PLL) circuits. A phase-locked loop (PLL) circuit is an electronic circuit with a variable frequency oscillator and a phase detector. The phase-locked loop (PLL) circuit adjusts the frequency of its oscillator based on a phase comparison between an input reference clock signal and the oscillator signal in a feedback loop. Maintaining a fixed phase relationship between the two signals guarantees that their frequencies are synchronized. The phase-locked loop (PLL) circuit may further have a plurality of post-scale counters which allow a number of output clock signals having harmonically related frequencies to be produced.

Conventional simulation models for phase-locked loop circuits have modeled the oscillator frequency by deriving the frequency of the input reference clock frequency and computing a division factor in the feedback loop. This is similar to computing the oscillator period as the inverse of its frequency with the exception that the period can be adjusted if the division factor is changed dynamically. However, this approach still suffers from the edge drifting issue due to rounding errors.

SUMMARY

The present invention provides a method for modeling clock signals when simulating a circuit using a simulation time scale. The circuit may include a phase-locked loop circuit to generate clock signals at respective clock frequencies derived from a variable frequency oscillator signal having an oscillator frequency. The variable frequency oscillator signal is synchronized with a reference clock signal having a reference frequency. The method may calculate the oscillator frequency as the least common multiple frequency of the clock frequencies generated by the phase-locked loop circuit. The method may further calculate a first clock period from the inverse of the oscillator frequency rounded down using the simulation time scale and a second clock period from the inverse of the oscillator frequency rounded up using the simulation time scale. During circuit simulation, the first and second clock periods may be used to simulate the clock signals generated by the phase-locked loop circuit.

It is appreciated that the present invention can be implemented in numerous ways, such as a process, an apparatus, a system, a device, instructions on a computer readable medium, or any desired combination of the above. Several inventive embodiments of the present invention are described below.

In certain embodiments, the method may yet further include calculating a greatest common divisor frequency of the oscillator frequency and the reference frequency to determine a synchronization frequency at which the simulated clock signals generated by the phase-locked loop circuit and the reference frequency are synchronized.

In other embodiments, the method may yet further include a parameter that limits the allowed edge drifting between the reference frequency and the oscillator frequency as well as determining a number of first and second clock periods such that the edge drifting between the reference frequency and the oscillator frequency is minimal.

Further features of the invention, its nature and various advantages, will be more apparent from the accompanying drawings and the following detailed description of the preferred embodiments.

DETAILED DESCRIPTION

The embodiments provided herein include methods for developing models for simulating the behavior of clock signals in electronic circuits, especially if those clock signals are generated by a phase-locked loop circuit.

It will be obvious to one skilled in the art, that the present exemplary embodiments may be practiced without some or all of these specific details. In other instances, well-known operations have not been described in detail in order not to unnecessarily obscure the present embodiments.

Figure 1:
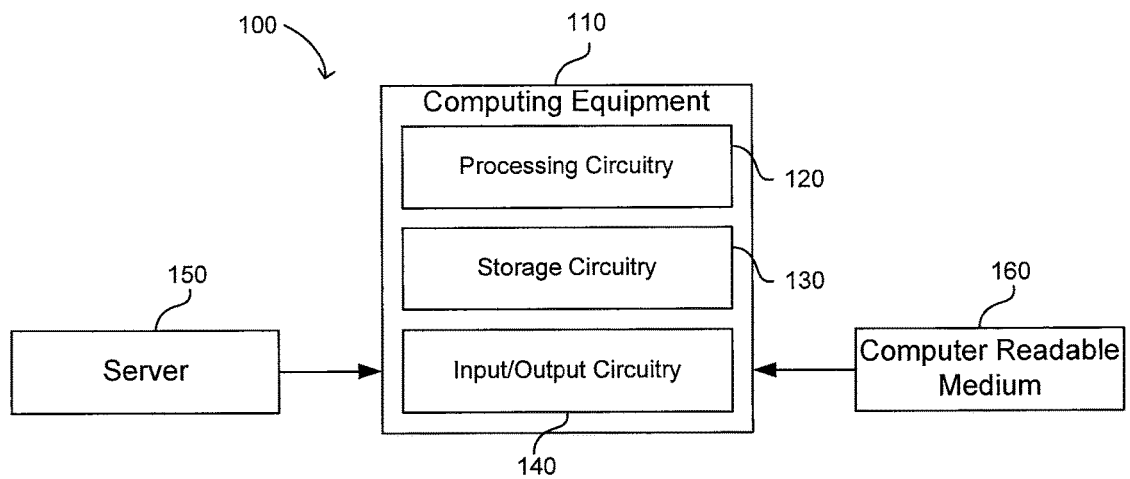
FIG. 1 is a diagram of illustrative computing resources used for performing the simulation of an electronic circuit in accordance with an embodiment of the present invention.

An illustrative embodiment of computing resources 100 that may be used for performing the simulation of an electronic circuit is shown in FIG. 1. Computing equipment 110 such as a workstation, a personal computer, or other suitable computing equipment may have processing circuitry 120, storage circuitry 130, and input/output circuitry 140 that may be used to communicate with a server 150 and a computer readable medium 160. In some scenarios, simulation may be performed without a server 150, without a computer readable medium 160, or without both. For example, the simulator may be installed on a server 150 or the license may be stored on a server. However, the simulator and the simulator license may both be stored using storage circuitry 130. Similarly, any information that is stored on the computer readable medium 160 may be stored using storage circuitry 130. Therefore, the example above is merely illustrative. Other embodiments may use different computing resources for performing the simulation of an electronic circuit.

Figure 2:
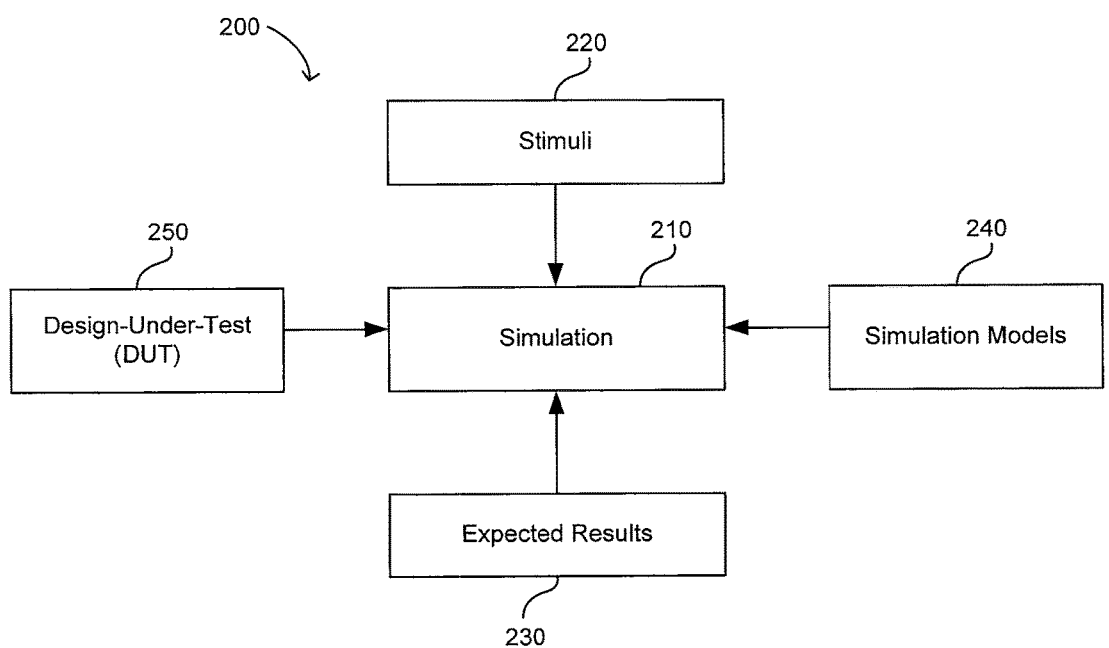
FIG. 2 is a simplified schematic block diagram of an illustrative simulation environment in accordance with an embodiment of the present invention.

FIG. 2 is a diagram of a simulation 200 of an electronic circuit. Simulating the behavior of an electronic circuit requires the use of a simulator which may be stored in storage circuitry such as the storage circuitry 130 inside computing equipment 110, on a server 150, or on a computer readable medium 160 such as a CD or a DVD or any other suitable computer readable medium. Appropriate processing circuitry such as processing circuitry 120 of FIG. 1 may run the simulator and thus execute the simulation 210. After loading the simulator, the processing circuitry may make a license request. Depending on the licensing setup, the license request may be sent to a server such as server 150 using input/output circuitry 140. Alternatively, the license may be verified by accessing other storage circuitry that contains the appropriate license. For example, in case of a node-locked license, the processing circuitry may request a license from storage circuitry 130 inside computing equipment 110.

The behavioral model of the electronic circuit is called the design-under-test (DUT) 250. The design-under-test (DUT) is itself a simulation model of the electronic circuit. It may be organized hierarchically and instantiate other simulation models 240. Simulating the behavior of an electronic circuit may further require a list of values for the input signals of the electronic circuit called stimuli 220 and a list of expected values for the output signals of the electronic circuit called expected results 230 that the design-under-test is supposed to produce in response to the stimuli. The design-under-test 250 as well as the simulation models 240, the stimuli 220, and the expected results 230 may reside in appropriate storage circuitry. Examples of appropriate storage circuitry suitable to store the design-under-test, the simulation models, the stimuli, and the expected results may include the storage circuitry 130 of the computing equipment 110, a server 150, or a computer readable medium 160.

During simulation, the simulator may first load and pre-process the design-under-test 250 and all other required simulation models 240 to create a simulator-internal representation of the electronic circuit. This simulator-internal representation may enable the computation and tracking of signals for the simulated electronic circuit. The simulator may then feed the stimuli (e.g., stimuli 220) as the input signals of the simulator-internal representation and propagate them successively towards outputs of the simulator-internal representation by computing the values of intermediate signals. As a final step, the simulator may compare the values of computed output signals (e.g., signals at the outputs of the simulator-internal representation that have been computed via propagation of input signals from the inputs to the outputs) to the expected output signal values. Mismatches between actual values and expected values, often referred to as simulation mismatches, may indicate unexpected behavior of the electronic circuit.

Synchronous electronic circuits have at least one clock signal. Clock signals may be defined by a clock frequency and a clock duty cycle. The clock duty cycle is the percentage of time for each clock period that the clock signal is at a high level. Clock signals may be generated by phase-locked loop (PLL) circuits because they have many desirable features. For example, a phase-locked loop circuit may be used for clock frequency multiplication where the input reference clock frequency may be in the range of several megahertz and the output frequency in the gigahertz range. A phase-locked loop (PLL) circuit may also be used to derive multiple clocks with harmonically related frequencies from the same reference clock. Phase-locked loop (PLL) circuits have many more applications such as for example clock network delay compensation, zero-delay buffering, and transmit clocking for transceivers, to name a few.

A phase-locked loop (PLL) circuit is an electronic circuit with a variable frequency oscillator and a phase detector. The phase-locked loop (PLL) circuit may adjust the oscillator frequency based on a phase comparison between an input reference clock signal and the variable frequency oscillator signal in a feedback loop. The phase-locked loop circuit may help to ensure a fixed phase relationship and thereby synchronized frequencies between the two signals.

The variable frequency oscillator signal may further be used to generate one or more output clock signals with harmonically related frequencies.

Figure 3:
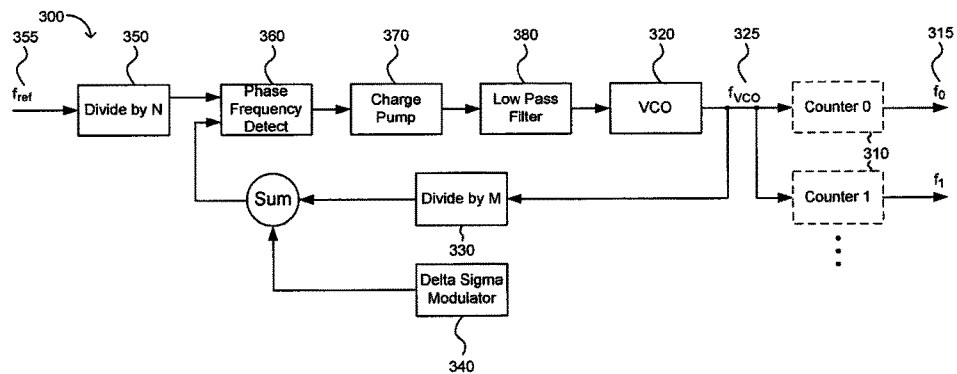
FIG. 3 is a diagram of an illustrative schematic block diagram of a fractional phase-locked loop circuit that may be simulated in accordance with an embodiment of the present invention.

An illustrative embodiment of a phase-locked loop (PLL) circuit 300 that may be simulated (e.g., using simulation 200 of FIG. 2) is depicted in FIG. 3. The phase-locked loop (PLL) circuit 300 can be configured as an integer phase-locked loop circuit, also called general purpose phase-locked loop (GPLL) circuit, or as a fractional phase-locked loop (fPLL) circuit. The input reference clock signal 355 with frequency f(ref) has its frequency divided by an integer division factor N in block 350. The phase and frequency of this signal is compared to the phase and frequency of a feedback signal. A variable frequency oscillator such as a voltage-controlled oscillator (VCO) 320 generates an oscillator-generated signal 325 with a frequency f(VCO). This signal has its frequency divided by an integer division factor M in block 330 in a feedback loop. The resulting signal is then added to a delta sigma modulator 340 generated signal to produce the feedback signal. PLL circuit 300 may be configured to implement a fractional phase-locked loop circuit (fPLL) by activating the delta sigma modulator or may be configured to implement an integer phase-locked loop circuit by deactivating the delta sigma modulator. The phase frequency comparison in block 360 between the frequency-divided input reference signal and the feedback signal generates an error signal proportional to the phase difference between the two signals with the help of a charge pump 370. In the example of FIG. 3, this signal is further filtered by a low-pass filter 380 and used to drive the voltage-controlled oscillator 320 which adjusts the frequency and phase of the oscillator-generated signal based on the signal it receives through the low-pass filter. The described phase-locked loop (PLL) circuit is merely illustrative of the functionality of a phase-locked loop (PLL) circuit. Other embodiments of a phase-locked loop (PLL) circuit exist. For example, a phase-locked loop (PLL) circuit may have a digital phase frequency detect, a digital filter, or a numerically controlled oscillator, just to name a few.

If desired, the variable frequency oscillator signal may further be used to generate multiple clock signals with frequencies f0, f1, etc. by dividing the frequency of the variable frequency oscillator signal using optional clock period counters counter0, counter1, etc.

Simulation may be executed according to a simulation time scale where the values of signals may be updated according to a schedule of events which may occur at consecutive time steps at the simulation time scale. The resolution of this time scale may be defined by the user. A higher resolution time scale may provide more accuracy at the potential expense of longer simulation times. For simulation purposes, clock signals may be modeled using a constant clock period and defining rising and falling clock edges within that period. The clock period is typically defined as the inverse of the clock frequency. However, due to the limited resolution of the simulation time scale, some clock periods may carry a rounding error whereas others may not. This may lead to edge drifting between the rising and falling edges of clock signals that have clock periods with a rounding error versus clock signals that have clock periods without a rounding error. Edge drifting may eventually lead to a change in the ordering of simulation events and thus to simulation failures caused by the simulation model.

Figure 4:
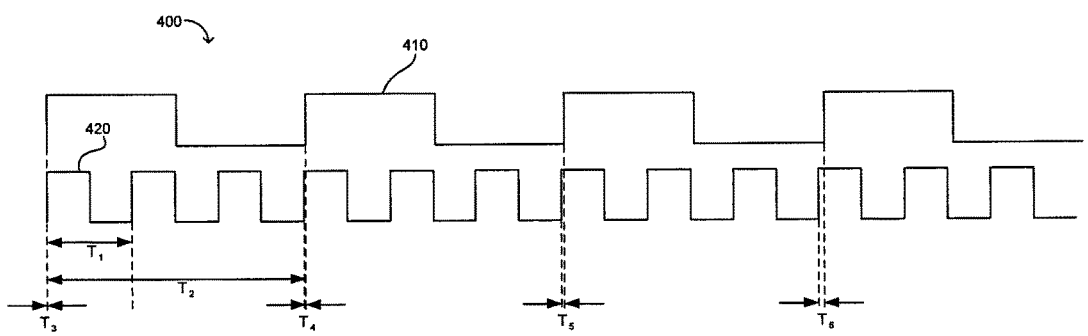
FIG. 4 is a waveform diagram showing an illustrative example for edge drifting between signals in accordance with an embodiment of the present invention.

FIG. 4 is a timing diagram that illustrates edge drifting between a first clock signal 410 and a second clock signal 420. As an example, the first clock signal 410 may have a frequency of 100 MHz whereas the second clock signal 420 may have a frequency of 300 MHz. The exact clock period of the first clock signal which is the inverse of its frequency is 10 ns while the exact clock period of the second clock signal is 3.3333333 . . . ns. For simulation purposes, the simulation time scale may have been defined to have a resolution of 1 ps. In the example of FIG. 4, the first clock signal is modeled with a clock period T2=10000 ps whereas the second clock signal is modeled with clock period T1=3333 ps. Initially during simulation, both clock signals may be perfectly aligned and the delay T3 between the rising edges of first and second clock is 0 ps. Given the frequency relationship between the two clocks and assuming that the rising edges of both clocks are aligned at initialization, one would expect perfect alignment between every rising edge of the first clock signal and every third rising edge of the second clock signal. However, due to the resolution of the simulation time scale, the fourth rising edge of the second clock signal may occur at 9999 ps while the second rising edge of the first clock signal may occur at 10000 ps thus creating a delay of T4=1 ps between the clock signals. The edge drifting increases with increasing simulation time. At the third and fourth rising edge of the first clock signal, the delay has increased to T5=2 ps and T6=3 ps respectively. The rising edges of both clock signals are aligned again after 3333 cycles of the first clock signal except that the second clock is ahead by one extra cycle.

Edge drifting may increase with decreasing resolution of the simulation time scale. For example, a simulation time scale of 1 ns would have the following effect. The second clock would now have a clock period T1=3 ns while the first clock has a clock period T2=10 ns. After only 3 cycles of the first clock signal the edge drifting may increase to 3 ns which is an entire clock period of the second clock signal. In other words, while three clock periods have passed for the first clock signal, 10 clock periods instead of the expected nine clock periods may have passed for the second clock signal.

Edge drifting during simulation may result in inaccurate simulation results. For example, an internal signal that is synchronous to the first clock signal may depend on two signals, a first signal that is synchronous to the first clock signal and a second signal that is synchronous to the second clock signal (e.g., the internal signal may be produced based on the first and second signals). After the fourth rising edge of the first clock signal, the expected value of the internal signal may depend on the value of the first signal generated at the third rising edge of the first clock signal and the value of the second signal generated at the ninth rising edge of the second clock signal. However, the actual value of the internal signal depends on the value of the second signal generated at the tenth rising edge of the second clock signal potentially leading to a simulation mismatch caused by the simulation model, i.e. the simulation model is no longer an accurate representation of the design-under-test.

Figure 5:
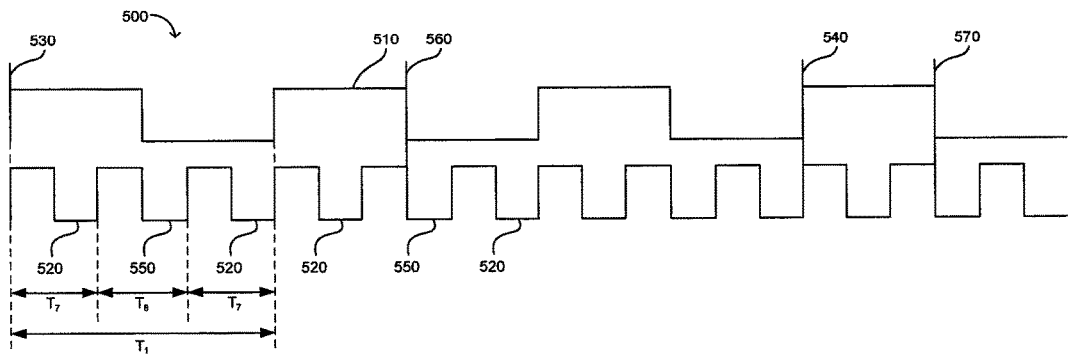
FIG. 5 is a waveform diagram showing two signals having reduced edge drifting in accordance with an embodiment of the present invention.

Inaccuracies in the simulation model such as those that cause edge drifting between clock signals are highly undesirable (e.g., because they can cause inaccurate simulation results). FIG. 5 shows a waveform diagram 500 of an embodiment for modeling the simulation behavior of two clock signals while minimizing the edge drifting problem. In the example of FIG. 5, each clock signal is modeled by two clock periods if rounding is required by the limited resolution of the simulation time scale. A first clock period is rounded up to the simulation time scale to form a slow clock period whereas a second clock period is rounded down to the simulation time scale to form a fast clock period.

As an example, the first clock signal may again have a frequency of 100 MHz and the second clock signal a frequency of 300 MHz. The simulation time scale may have a resolution of 1 ns. The first clock signal 510 may again be modeled by a clock period of T1=10 ns because rounding is not required. The second clock signal may be modeled by two clock periods because rounding is required. Hence, the second clock signal may have a fast clock period 520 of T7=3 ns and a slow clock period 550 of T8=4 ns.

A synchronization frequency between the first and second clock signals may be computed as the greatest common divisor of the first and second clock frequency. In the example of FIG. 5, the synchronization frequency is 100 MHz. In other words, the first and second clock signals may be aligned every 100 MHz. In some scenarios, the first and second clock frequencies may not have a positive integer greater than 1 that divides both frequencies without a remainder. In this case, the synchronization frequency may be computed as the largest positive integer that divides the first and second clock frequencies with a remainder that is smaller than a threshold. The value of this threshold may be user defined. Alternatively, the value of this threshold may be computed iteratively. For example, e.g. by performing a binary search may be performed starting with the smaller of the first and second frequency as the threshold value. A new threshold value may be computed iteratively by dividing the threshold value by 2. This step may be repeated for as long as a common divisor of the first and second clock frequency exists such that the remainder of the integer division of the first and second clock frequency by that common divisor is smaller than the new threshold value.

The synchronization frequency may be computed from the least common multiple of the exact first and second clock periods. In the example of FIG. 5, the synchronization frequency may be every 10 ns or one clock period of the first clock signal. In this scenario the second clock signal may be modeled using two fast clock periods T7=3 ns and one slow clock period T8=4 ns. Selecting the order of fast and slow clock periods may further reduce edge drifting. Consider the scenario in which the three clock periods of the second clock signals are in the order fast period 520, slow period 550, and fast period 520. In this scenario, even the falling edges of the first clock signal and the falling edges of the slow period of the second clock signal are perfectly aligned as illustrated at times 560 (15 ns) and 570 (35 ns) as are the rising clock edges at times 530 (0 ns) and 540 (30 ns).

Figure 6:
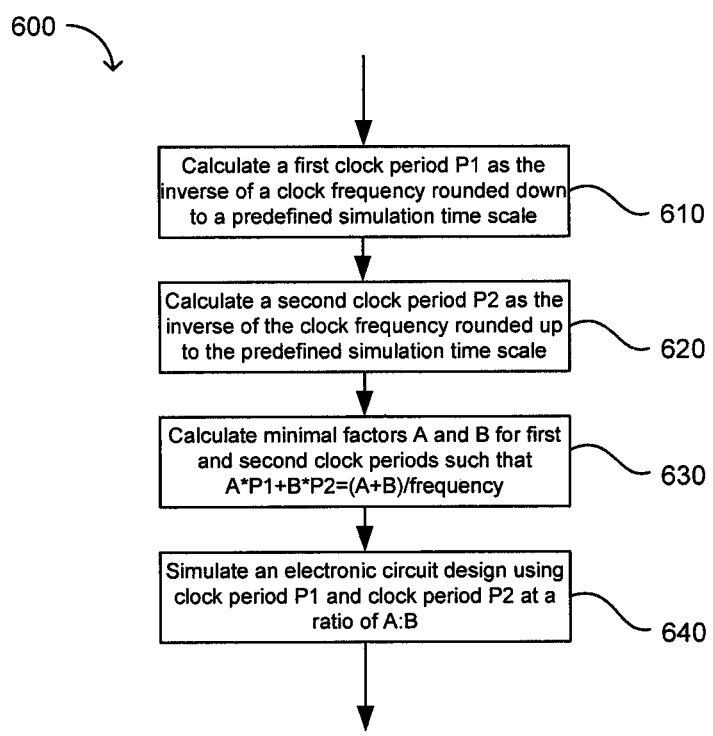
FIG. 6 is a flow chart of illustrative steps that may be performed to reduce edge drifting during simulation in accordance with an embodiment of the present invention.

FIG. 6 is a flow chart that further illustrates the steps involved in determining fast and slow clock periods for a clock signal and their ratio during simulation.

During step 610, the fast clock period may be calculated as a first clock period P1 by rounding the inverse of the clock frequency down to a simulation time scale. Similarly, the second clock period may be calculated as a second clock period P2 by rounding the inverse of the clock frequency up to the simulation time scale during step 620.

Steps 610 and 620 may be performed in any desired order. For example, the slow clock period 620 may be calculated before calculating the fast clock period 610, or the calculation of the fast and slow clock periods may be performed in parallel.

During step 630, the ratio A:B between the first and second clock periods may be calculated as A*P1+B*P2=(A+B)/frequency such that (A+B) is minimal. (A+B)/frequency is the minimum number of exact clock cycles after which the total time period matches exactly the simulation time scale. The ratio A:B is obtained by distributing the number (A+B) between the fast and slow clock cycles.

During step 640, the electronic circuit and the clock signal may be simulated by using the first period P1 and the second period P2 in a ratio of A:B.

Figure 7:
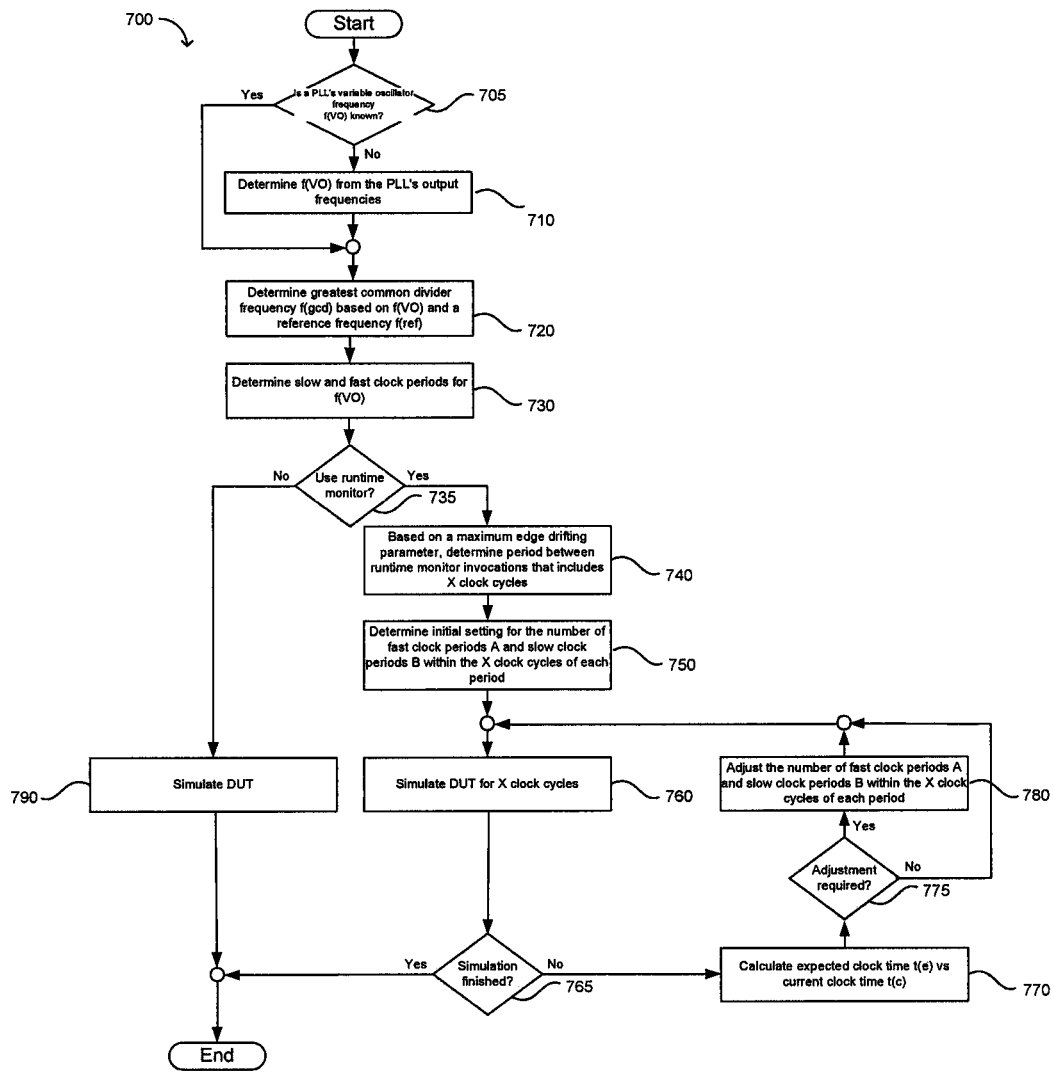
FIG. 7 is a flow chart of illustrative steps that may be performed to simulate a phase-locked loop circuit in accordance with an embodiment of the present invention.

FIG. 7 is a flow chart provided to illustrate the concept of modeling and adjusting clock signals for simulation purposes if they are generated by a phase-locked loop (PLL) circuit (e.g., PLL circuit 300 of FIG. 3). Depending on the configuration, a phase-locked loop (PLL) circuit may have multiple output signals with frequencies f0, f1, ..., fN, generated for example by optional counters 310 of FIG. 3. If desired, the phase-locked loop circuit may have only one output signal which may be the signal generated by the variable frequency oscillator such as for example the voltage controlled oscillator (VCO) 320 of the PLL circuit. In the former case, the oscillator frequency may be unknown.

During step 710, if the oscillator frequency is unknown 705, it may be determined from the phase-locked loop (PLL) circuit's output signal frequencies. For example, if the output signals are frequency divided signals of the variable frequency oscillator signal using for example counters 310, the oscillator frequency may be determined from the frequencies of the multiple output signals by computing their least common multiple or a multiple of the least common multiple.

The synchronization frequency between the variable frequency oscillator signal and a reference clock signal indicates the time period after which both signals are supposed to be aligned. Therefore, it is also the rate at which the two signals may be re-aligned.

During step 720, the maximum synchronization frequency f(gcd) may be computed as the greatest common divisor frequency between the reference frequency f(ref) and the oscillator frequency f(VO). The actual synchronization frequency may also be chosen to be the maximum synchronization frequency divided by powers of 2.

In case of an integer phase-locked loop circuit, for example, the input reference clock signal with frequency f(ref) may have its frequency divided by an integer division factor N and the variable oscillator signal with frequency f(VO) may have its frequency divided by an integer division factor M. The synchronization frequency f(gcd) may then be computed as the greatest common divisor between f(ref) and f(VO) and the integer division factors N and M may then be determined as shown in equations 1 and 2.

$$N = f(ref)/f(gcd) \quad (1)$$

$$M = f(VO)/f(gcd) \quad (2)$$

In some scenarios, depending on the values for f(ref) and f(VO) and the valid range for integer division factors N and M, there may not be a valid maximum synchronization frequency f(gcd). For example if f(gcd) is as shown in equations 3 or 4.

$$f(gcd) \leq f(ref)/N \quad (3)$$

$$f(gcd) \leq f(VO)/M \quad (4)$$

In this case, the maximum synchronization frequency f(gcd) may be computed as the largest positive integer that divides the reference frequency f(ref) and the oscillator frequency f(VO) with a remainder that is smaller than a threshold. The maximum value for this threshold th(max) is dependent on the frequency of the reference clock signal f(ref), the frequency of the variable oscillator f(VO) as well as the maximum values that the PLL can have for integer division factors M and N because of the relationship as shown in equation 5.

$$f(gcd)=f(ref)/N=f(VO)/M \qquad (5)$$

Once the maximum threshold value for the remainder th(max) has been determined, and a frequency f(gcd) exists such that the remainder of the integer division of the reference frequency f(ref) by f(gcd) is smaller than the maximum value of the threshold th(max), a smaller value for this threshold may be found doing an iterative binary search between 0 and th(max). For example, the next iteration determines a synchronization frequency f(gcd) such that the remainder of the integer division of the reference frequency f(ref) by f(gcd) is smaller than th(max)/2.

In case of a fractional PLL (fPLL) circuit, N and M may be real numbers. For example, M and N may be represented as shown in equations 6 and 7 with integer values K, L, p, q, r, s.

$$M=L+p/2^r \qquad (6)$$

$$N=K+q/2^s \qquad (7)$$

Multiplying both equations with $2^t$ with t=max(r,$) reduces the problem of finding the maximum synchronization frequency for a fractional PLL to the problem of finding the maximum synchronization frequency for an integer PLL with f(gcd) as shown in equation 8.

$$f(gcd) = f(ref)/(K*2^t + q*2^{(t-s)}) \qquad (8)$$
$$= f(VO)/(L*2^t + p*2^{(t-r)})$$

However, L and K could be orders of magnitude larger than M and N in the integer case. This has the undesirable effect that the synchronization frequency f(gcd) of a fractional PLL may be orders of magnitude smaller than the synchronization frequency of an integer PLL. Hence, the time period between synchronization events may be orders of magnitude larger for a fractional PLL than for an integer PLL.

During step 730, in an effort to minimize edge drifting between the reference signal and the variable oscillator signal between synchronization events, the variable oscillator signal may be modeled using a slow and fast clock period. The steps involved in determining the fast and slow clock periods have been described in the previous paragraph in connection with the detailed description of FIG. 6.

In an embodiment of the present invention a parameter may define a legal range for edge drifting between the reference clock signal and the variable frequency oscillator signal. A runtime monitor may be used to decide whether adjusting the ratio between fast and slow clock periods of the variable frequency oscillator signal may be required 775 such that the edge drifting remains within the legal range.

The use of this runtime monitor may not always be required 735 (e.g., step 735 may be optional and flow chart 700 may proceed directly to step 790 from step 730). For example, a projected edge drifting between the reference clock signal and the variable frequency oscillator signal may be computed based on the fast and slow clock periods. This projected edge drifting may always be within the legal edge drifting range. Using the runtime monitor is not required in this case. If the use of the runtime monitor is not required, the electronic circuit may be simulated without invoking the runtime monitor 790.

In cases where using the runtime monitor is required to keep the edge drifting within the legal range, the period between runtime monitor invocations may be computed as a number of X clock cycles 740 which may be based on the parameter that defines the legal range for edge drifting. Setting the parameter such that the legal range for edge drifting is reduced may decrease edge drifting and thus improve the simulation quality. However, it may also lead to a decreasing number of X clock cycles between runtime monitor invocations which in turn increases the simulation runtime. Therefore, a user may trade off simulation quality for simulation runtime by choosing an appropriate setting for this parameter.

During step 750, an initial ratio A:B between the fast and slow clock periods of the variable frequency oscillator signal may further be determined within the X clock cycles. The A fast clock periods and the B slow clock periods may be ordered. For example, they may be ordered such that the edge drifting is minimal at each clock edge. All steps 705 to 750 may be executed during the initialization phase of the simulation (e.g., steps 705 to 750 may be executed only once during the initialization phase).

The following steps 760 to 780 may be executed multiple times in an iterative fashion until the simulation has finished. As part of an iteration i, the simulation may be executed for X clock cycles 760. Depending on the total simulation time that may be specified by the user, the simulation may have finished 765.

During step 770, the current clock time t(c) may be calculated based on the current ratio A(i-1):B(i-1) of the fast and slow clock periods from the previous iteration i-1 and their respective lengths if the simulation has not finished 765. The expected clock time t(e) may also be calculated based on an exact clock period of the variable frequency oscillator signal 770. Depending on the difference between the expected clock time t(e) and the current clock time t(c), and the parameter defining a legal range for edge drifting an adjustment may be required 775.

During step 780, the ratio A(i):B(i) between fast and slow clock periods within the X clock cycles of each period may be changed if an adjustment is required. For example, if the expected clock time t(e) is earlier than the current clock time t(c), the number of fast clock periods A(i-1) from the previous iteration may be increased by a number n to A(i)=A(i-1)+n and the number of slow clock periods decreased by that same number n B(i)=B(i-1)-n. If the expected clock time t(e) is later than the current clock time t(c), then the number of slow clock periods B may be increased by a number n B(i)=B(i-1)+n and the number of fast clock periods A decreased by that same number n A(i)=A(i-1)-n. The number n may be equal to one. It may also be equal to an integer number bigger than one. It may be chosen to be the same or different between subsequent iterations.

The ratio A(i):B(i) between fast and slow clock periods may further be limited by maximum and minimum values for the ratio A(i)/B(i). The ratio A(i):B(i) may also be limited by specifying maximum threshold values A(t) and B(t) for A(i) and B(i). Those threshold values may be in place to prevent over compensating by either having too many fast clock periods or too many slow clock periods within the X clock cycles of a period. The threshold values may be user defined. They may also be computed together with the initial ratio A:B during the initialization process. A possible adjustment may be that the ratio A(i):B(i) between the fast and slow clock periods during the current iteration are reset to their initial ratio A(i)=A and B(i)=B if either A(i) or B(i)

would have passed the threshold values. For example, if the adjustment at iteration i would increase the current value A(i−1) by n and by doing so pass the threshold value for A(i), i.e. A(t)<A(i−1)+n, then both A(i) and B(i) may be reset to the initial values A and B respectively instead. Both A(i) and B(i) may also be reset to the initial values A and B if the adjustment at iteration i would pass the threshold for B(i), i.e. B(t)<B(i−1)+n. If the adjustment is not required 775, the adjustment step may be bypassed. Whether the ratio A:B between fast and slow clock periods has been updated or not in the current iteration i, a new iteration (i+1) starts again with simulating the electronic circuit for X clock cycles 760.

The electronic circuit with clock signals or a clock generation circuit such as a phase-locked loop circuit described herein may be incorporated into any suitable electronic device or system of electronic devices. For example, the electronic circuit may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A non-transitory computer-readable storage medium for simulating circuitry using a simulation time scale, wherein the simulated circuitry operates based on at least one clock signal having a clock frequency, the non-transitory computer-readable storage medium comprising instructions for:
    calculating an inverse of the clock frequency to determine an exact clock period;
    rounding down the exact clock period using the simulation time scale to determine a first clock period;
    rounding up the exact clock period using the simulation time scale to determine a second clock period; and
    simulating the circuitry using the first and second clock periods by toggling between simulating the circuitry using the first clock period and simulating the circuitry using the second clock period.

2. The non-transitory computer-readable storage medium for simulating circuitry using a simulation time scale defined in claim 1 wherein the simulated circuitry operates based on a clock signal generated by phase-locked loop circuitry.

3. The non-transitory computer-readable storage medium defined in claim 1 further comprising instructions for:
    determining a minimum number of exact clock periods having a total time period that matches the simulation time scale.

4. The non-transitory computer-readable storage medium defined in claim 3 further comprising instructions for:
    calculating a first number of first clock periods and a second number of second clock periods so that a summed total time period of the first number of first clock periods and the second number of second clock periods matches the total time period of the minimum number of exact clock periods.

5. The non-transitory computer-readable storage medium defined in claim 4 wherein simulating the circuitry using the first and second clock periods comprises:
    simulating the circuitry for successive time frames, wherein each time frame comprises the first number of first clock periods and the second number of second clock periods.

6. The non-transitory computer-readable storage medium defined in claim 5 wherein the first clock periods and the second clock periods of each time frame are simulated in an order and wherein simulating the circuitry for each time frame of the successive time frames comprises:
    determining the order of the first clock periods and the second clock periods of the time frame.

7. The non-transitory computer-readable storage medium defined in claim 6 wherein determining the order of the first clock periods and the second clock periods of the time frame comprises:
    determining the order of the first clock periods and the second clock periods of the time frame based on the exact clock period so that deviation between edges of the exact clock period and edges of the time frame are minimized.

8. A method for using a simulation tool implemented on computing equipment to simulate a circuit, wherein the circuit includes phase-locked loop circuitry operable to generate a plurality of clock signals each having a respective clock frequency from a reference clock signal having a reference frequency, the method comprising:
    with the simulation tool on the computing equipment, calculating a least common multiple frequency of the plurality of clock frequencies that are generated by the phase-locked loop circuitry;
    with the simulation tool on the computing equipment, calculating a first clock period from the inverse of the least common multiple frequency rounded down using a simulation time scale;
    with the simulation tool on the computing equipment, calculating a second clock period from the inverse of the least common multiple frequency rounded up using the simulation time scale;
    with the simulation tool on the computing equipment, determining a minimum number of exact clock periods having a total time period that matches the simulation time scale;
    with the simulation tool on the computing equipment, calculating a first number of first clock periods and a second number of second clock periods so that a summed total time period of the first number of first clock periods and the second number of second clock periods matches the total time period of the minimum number of exact clock periods; and
    with the simulation tool on the computing equipment, simulating the circuit using the first and second clock periods to simulate the plurality of clock signals.

9. The method defined in claim 8 further comprising:
    calculating a greatest common divisor frequency from the least common multiple frequency and the reference frequency; and synchronizing the simulated plurality of clock signals to the reference frequency at the greatest common divisor frequency.

10. The method defined in claim 9 wherein the least common multiple frequency and the reference frequency have no greatest common divisor, the method further comprising:
calculating a largest positive integer frequency that divides the least common multiple frequency and the reference frequency with a remainder that is smaller than a threshold; and
synchronizing the simulated plurality of clock signals to the reference frequency at the largest positive integer frequency.

11. The method defined in claim 10 wherein the simulation model has a parameter indicative of maximum edge drifting between the reference frequency and the least common multiple frequency, the method further comprising:
determining an initial number of first and second clock periods such that the edge drifting between the reference frequency and the least common multiple frequency is minimal.

12. The method defined in claim 11 further comprising:
performing calculations during the initialization phase of the simulation to determine values that are constant during simulation.

13. The method defined in claim 11 wherein the simulation model further has a runtime monitor operable to adjust the number of first and second clock periods, the method further comprising:
determining whether the runtime monitor needs to be invoked based on the parameter.

14. The method defined in claim 13 further comprising:
calculating an expected time based on the inverse of the least common multiple frequency;
calculating a current time based on the first and second clock periods; and
determining whether the runtime monitor needs to be invoked based on the expected time and the current time.

15. The method defined in claim 13 further comprising:
determining that the runtime monitor doesn't need to be invoked; and
simulating the circuit without invoking the runtime monitor.

16. The method defined in claim 13 further comprising:
determining a period between runtime monitor invocations based on the parameter; and
simulating the circuit using the runtime monitor at each period to adjust the number of first and second clock periods.

17. The method defined in claim 16 further comprising:
calculating thresholds for the number of first and second clock periods based on a maximum adjustment; and
simulating the circuit wherein the number of first and second clock periods are reset to their initial number if the actual number exceed the calculated thresholds.

18. The method defined in claim 16 further comprising:
simulating the circuit wherein the runtime monitor skips adjusting the number of first and second clock periods if this is not required.

19. A non-transitory computer-readable storage medium for simulating a circuit using a simulation time scale, wherein the circuit includes a fractional phase-locked loop circuit operable to generate a plurality of clock signals having respective clock frequencies, wherein the fractional phase-locked loop circuit has an input reference clock signal with a reference frequency and a variable frequency oscillator with an oscillator frequency, and wherein the fractional phase-locked loop is operable to divide the reference frequency by a real division factor Y and the oscillator frequency by a real division factor Z, the non-transitory computer-readable storage medium comprising instructions for:
computing the oscillator frequency based on the clock frequencies of the plurality of clock signals that are generated by the fractional phase-locked loop circuit;
computing a multiplier factor between real division factors Y and Z such that the multiplier factor multiplied with real division factor Y is a first integer number and the multiplier factor multiplied with real division factor Z is a second integer number;
computing a synchronization frequency between the reference frequency and the oscillator frequency based on the reference frequency, the oscillator frequency, the real division factors Y and Z, and the multiplier factor; and
synchronizing the oscillator frequency to the reference frequency at the synchronization frequency.

20. The non-transitory computer-readable storage medium defined in claim 19 wherein computing a synchronization frequency between the reference frequency and the oscillator frequency based on the reference frequency, the oscillator frequency, the real division factors Y and Z, and the multiplier factor further comprises:
computing the synchronization frequency as a greatest common divisor frequency between the oscillator frequency divided by the multiplication of the real division factor Z with the multiplier factor and the reference frequency divided by the multiplication of the real division factor Y with the multiplier factor.

21. The non-transitory computer-readable storage medium defined in claim 19 wherein computing a synchronization frequency between the reference frequency and the oscillator frequency based on the reference frequency, the oscillator frequency, the real division factors Y and Z, and the multiplier factor further comprises:
computing the synchronization frequency as a largest positive integer frequency that divides the oscillator frequency divided by the multiplication of the real division factor Z with the multiplier factor and the reference frequency divided by the multiplication of the real division factor Y with the multiplier factor with a remainder that is smaller than a threshold.

22. The non-transitory computer-readable storage medium defined in claim 19 further comprising instructions for:
computing an inverse of the oscillator frequency to determine an exact clock period;
rounding down the exact clock period using the simulation time scale to determine a fast clock period;
rounding up the inverse of the exact clock period using the simulation time scale to determine a slow clock period; and
simulating the circuit wherein clock periods of the plurality of clock signals generated by the fractional phase-locked loop circuit are based on the fast and slow clock periods.

23. The non-transitory computer-readable storage medium defined in claim 22 further comprising instructions for:
computing an initial ratio between fast and slow clock periods such that the deviation from the exact clock period is minimal; and simulating the circuit using the initial ratio between fast and slow clock periods.

24. The non-transitory computer-readable storage medium defined in claim 23 wherein the simulation takes a parameter indicative of a targeted accuracy of the clock signals, the non-transitory computer-readable storage medium further comprising instructions for:
 computing a targeted accuracy of the clock signals based on the exact clock period;
 computing an actual accuracy of the clock signals based on the fast and slow clock periods; and
 adjusting the ratio between fast and slow clock periods to a new adjusted ratio based on the actual and targeted accuracy.

25. The non-transitory computer-readable storage medium defined in claim 24 further comprising instructions for:
 computing whether the actual accuracy is always better than the targeted accuracy; and
 disabling the computation of the actual accuracy and the adjustment of the ratio between fast and slow clock periods if the actual accuracy is always better than the targeted accuracy.

26. The non-transitory computer-readable storage medium defined in claim 24 further comprising instructions for:
 deciding whether adjusting the ratio between fast and slow clock periods is required; and
 adjusting the ratio between fast and slow clock periods only if the adjustment is required.

27. The non-transitory computer-readable storage medium defined in claim 24 further comprising instructions for:
 calculating a threshold for the fast and slow clock periods;
 adjusting the ratio between fast and slow clock periods back to the initial ratio if the new adjusted ratio exceeds the threshold.

28. The non-transitory computer-readable storage medium defined in claim 24 further comprising:
 computing the targeted accuracy and the actual accuracy wherein the accuracy criterion is based on allowed edge drifting between the reference clock signal and the oscillator signal.

* * * * *